(12) United States Patent
Saitoh (10) Patent No.: US 11,573,662 B2
(45) Date of Patent: Feb. 7, 2023

(54) DETECTION DEVICE (71) Applicant: Japan Display Inc., Tokyo (JP)

(72) Inventor: Akihiko Saitoh, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/514,747

(22) Filed: Oct. 29, 2021

(65) Prior Publication Data

US 2022/0050574 A1   Feb. 17, 2022

Related U.S. Application Data

(63) Continuation of application No. 17/154,092, filed on Jan. 21, 2021, now Pat. No. 11,169,637.

(30) Foreign Application Priority Data

Jan. 23, 2020 (JP) .............................. JP2020-009441

(51) Int. Cl.
*G06F 3/041* (2006.01)
*G06F 3/042* (2006.01)

(52) U.S. Cl.
CPC ........ *G06F 3/04166* (2019.05); *G06F 3/0412* (2013.01); *G06F 3/0428* (2013.01)

(58) Field of Classification Search
CPC ... G06F 3/0412; G06F 3/04166; G06F 3/0428

USPC .......................................................... 345/174
See application file for complete search history.

(56) References Cited

U.S. PATENT DOCUMENTS 6,295,142 B1 * 9/2001 Watanabe ................ H04N 5/32
345/100
6,459,132 B1 * 10/2002 Mochizuki ........ H01L 29/66742
257/443
2010/0302134 A1 12/2010 Hasegawa
2012/0032193 A1 2/2012 Kurokawa et al.

FOREIGN PATENT DOCUMENTS

JP 2010277378 A 12/2010
JP 2012256812 A 12/2012

* cited by examiner

*Primary Examiner* — Calvin C Ma
(74) *Attorney, Agent, or Firm* — K&L Gates LLP (57) ABSTRACT

A detection device is provided and includes insulating substrate; detection element including first photodiode, first thin film transistor, second thin film transistor, and third thin film transistor; dummy element including second photodiode and first thin film transistor; and first scan line, wherein first scan line is a gate of each of first thin film transistors, dummy element is located adjacent to detection element, and dummy element includes first photodiode and none of second thin film transistor and third thin film transistor.

13 Claims, 11 Drawing Sheets

DETECTION DEVICE

CROSS-REFERENCE TO RELATED APPLICATIONS

This application is a U.S. Continuation Application of U.S. patent application Ser. No. 17/154,092, filed Jan. 21, 2021, which claims priority from Japanese Application No. 2020-009441, filed on Jan. 23, 2020, the contents of which are incorporated by reference herein in its entirety.

BACKGROUND

1. Technical Field

The present disclosure relates to a detection device.

2. Description of the Related Art

A liquid crystal display device of Japanese Patent Application Laid-open Publication No. 2010-277378 includes a plurality of photosensors. The photosensors each include a photodiode. Light emitted from the photodiode is converted into a signal (electrical charge). The photosensors are typically arranged in a matrix having a row-column configuration. The photosensors arranged in a matrix are used in detection devices, for example, as biometric sensors, such as fingerprint sensors and vein sensors, that detect biological information.

The photodiode has parasitic capacitance. The photodiode is also affected by the parasitic capacitance of photodiodes adjacent thereto. Photodiodes arranged around a photodiode located in a central portion of the photosensors arranged in a matrix are large in number, and thus the photodiode located in the central portion is affected by a large amount of parasitic capacitance. However, photodiodes arranged around a photodiode located at an end portion of the photosensors arranged in a matrix are small in number. Therefore, the affected amount of the parasitic capacitance differs between the photodiode located in the central portion and the photodiode located at the end portion.

For the foregoing reasons, there is a need for a detection device capable of equalizing the affected amount of the parasitic capacitance of each of the photodiodes.

SUMMARY

According to an aspect, a detection device includes: a substrate having a sensor region; and a plurality of photosensors arranged in a first direction and a second direction orthogonal to the first direction in the sensor region. The substrate includes: a plurality of read control scan lines extending in the first direction in the sensor region and configured to transmit read control signals; and a plurality of output signal lines extending in the second direction in the sensor region. The photosensors includes: a plurality of dummy elements comprising first photodiodes and arranged along a contour of the sensor region; and a plurality of detection elements comprising second photodiodes and arranged on an inner side of a frame-like dummy region in which the dummy elements are arranged. The dummy elements are coupled to neither the read control scan lines nor the output signal lines. The detection elements are coupled to the read control scan lines and the output signal lines and are configured to, after receiving the read control signals, output signals generated by the first photodiodes to the output signal lines.

DETAILED DESCRIPTION

The following describes a mode (embodiment) for carrying out the present invention in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the invention. To further clarify the description, widths, thicknesses, shapes, and the like of various parts may be schematically illustrated in the drawings as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

Embodiment

Figure 1A:
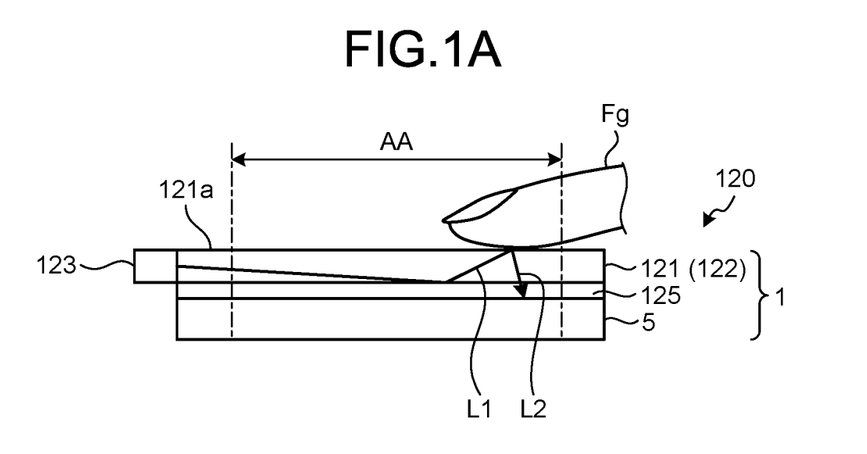
FIG. 1A is a sectional view illustrating a schematic sectional configuration of a detection apparatus having an illumination device, the detection apparatus including a detection device according to an embodiment of the present disclosure.
Figure 1B:
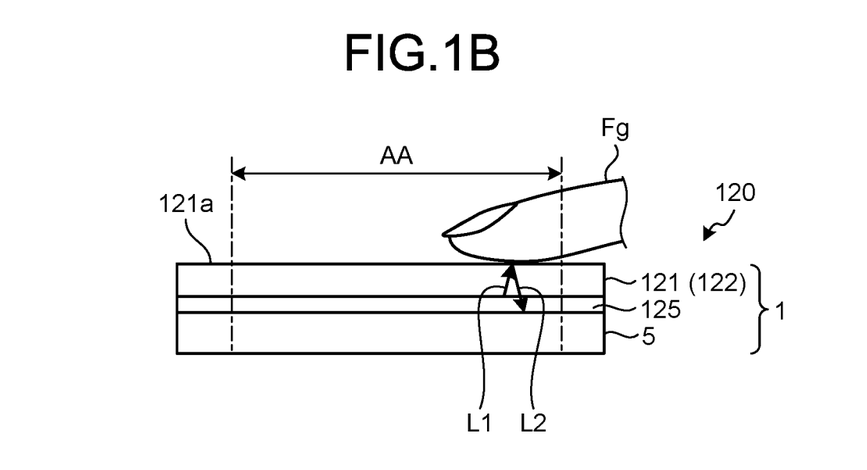
FIG. 1B is a sectional view illustrating a schematic sectional configuration of the detection apparatus having an illumination device, the detection apparatus including the detection device according to a first modification of the embodiment.
Figure 1C:
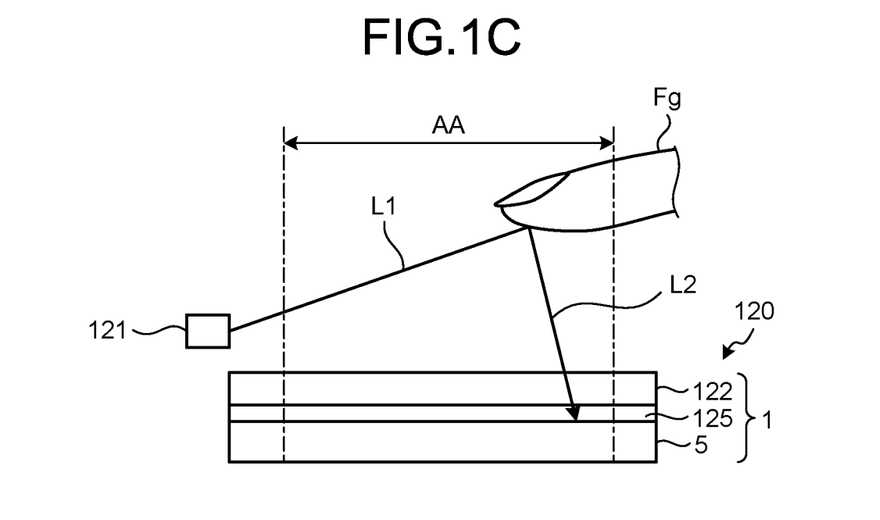
FIG. 1C is a sectional view illustrating a schematic sectional configuration of the detection apparatus having an illumination device, the detection apparatus including the detection device according to a second modification of the embodiment.
Figure 1D:
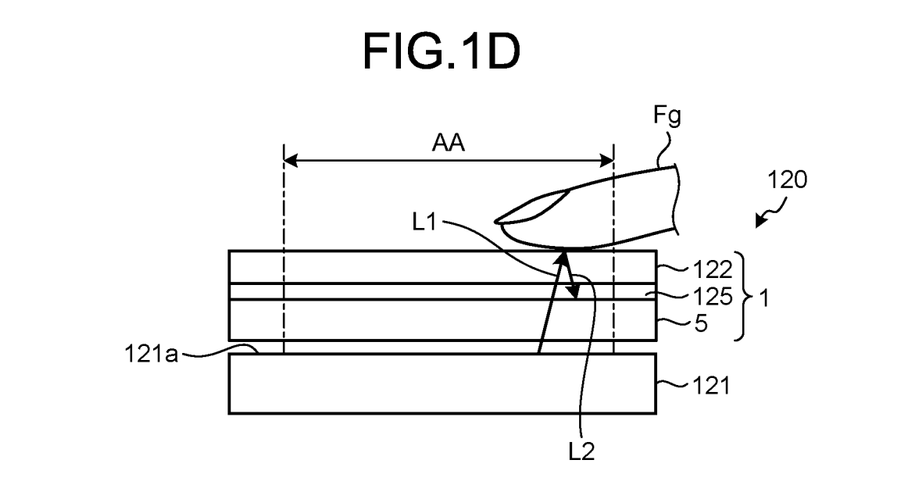
FIG. 1D is a sectional view illustrating a schematic sectional configuration of the detection apparatus having an illumination device, the detection apparatus including the detection device according to a third modification of the embodiment.

FIG. 1A is a sectional view illustrating a schematic sectional configuration of a detection apparatus having an illumination device, the detection apparatus including a detection device according to an embodiment of the present disclosure. FIG. 1B is a sectional view illustrating a schematic sectional configuration of the detection apparatus having an illumination device, the detection apparatus including the detection device according to a first modification of the embodiment. FIG. 1C is a sectional view illustrating a schematic sectional configuration of the detection apparatus having an illumination device, the detection apparatus including the detection device according to a second modification of the embodiment. FIG. 1D is a sectional view illustrating a schematic sectional configuration of the detection apparatus having an illumination device, the detection apparatus including the detection device according to a third modification of the embodiment.

As illustrated in FIG. 1A, a detection apparatus 120 having an illumination device includes a detection device 1 and an illumination device 121. The detection device 1 includes a sensor substrate 5, an adhesive layer 125, and a cover member 122. That is, the sensor substrate 5, the adhesive layer 125, and the cover member 122 are stacked in the order as listed, in a direction orthogonal to a surface of the sensor substrate 5. The cover member 122 of the detection device 1 can be replaced with the illumination device 121, as will be described later.

As illustrated in FIG. 1A, the illumination device 121 may be, for example, what is called a side light-type front light that uses the cover member 122 as a light guide plate provided at a location corresponding to a sensor region AA of the detection device 1, and that includes a plurality of light sources 123 arranged side by side at one end or both ends of the cover member 122. That is, the cover member 122 has a light-emitting surface 121a for emitting light, and serves as one component of the illumination device 121. The illumination device 121 emits light L1 from the light-emitting surface 121a of the cover member 122 toward a finger Fg serving as a detection target. For example, light-emitting diodes (LEDs), which emit light in a predetermined color, are used as the light sources.

As illustrated in FIG. 1B, the illumination device 121 may include light sources (such as LEDs) provided immediately below the sensor region AA of the detection device 1, and the illumination device 121 including the light sources serves also as the cover member 122.

The illumination device 121 is not limited to the example of FIG. 1B. As illustrated in FIG. 1C, the illumination device 121 may be provided on a lateral side of or above the cover member 122, and may emit the light L1 to the finger Fg from the lateral side of or above the finger Fg.

Furthermore, as illustrated in FIG. 1D, the illumination device 121 may be what is called a direct-type backlight that includes light sources (such as LEDs) provided in the sensor region AA of the detection device 1.

The light L1 emitted from the illumination device 121 is reflected as light L2 by the finger Fg serving as the detection target. The detection device 1 detects the light L2 reflected by the finger Fg to detect ridges and varies (such as a fingerprint) on the surface of the finger Fg. The detection device 1 may further detect the light L2 reflected inside the finger Fg to detect information on a living body in addition to detecting the fingerprint. Examples of the information on the living body include an image of a blood vessel, such as a vein, pulsation, and a pulse wave. The color of the light L1 from the illumination device 121 may be varied depending on the detection target.

The cover member 122 is a member for protecting the sensor substrate 5 and covers the sensor substrate 5. The illumination device 121 may have a structure to double as the cover member 122 as described above. In the structures illustrated in FIGS. 1C and 1D in which the cover member 122 is separate from the illumination device 121, the cover member 122 is, for example, a glass substrate. The cover member 122 is not limited to the glass substrate and may be, for example, a resin substrate. The cover member 122 need not be provided. In this case, the surface of the sensor substrate 5 is provided with a protective layer of, for example, an insulating film, and the finger Fg contacts the protective layer of the detection device 1.

As illustrated in FIG. 1B, the detection apparatus 120 having an illumination device may be provided with a display panel instead of the illumination device 121. The display panel may be, for example, an organic electroluminescent (EL) diode (organic light-emitting diode (OLED)) panel or an inorganic EL display (micro-LED or mini-LED) panel. Alternatively, the display panel may be a liquid crystal display (LCD) panel using liquid crystal elements as display elements or an electrophoretic display (EPD) panel using electrophoretic elements as display elements. Also in this case, the fingerprint of the finger Fg and the information on the living body can be detected based on the light L2 resulting from the reflection of the display light (light L1), which has been emitted from the display panel, by the finger Fg.

Figure 2:
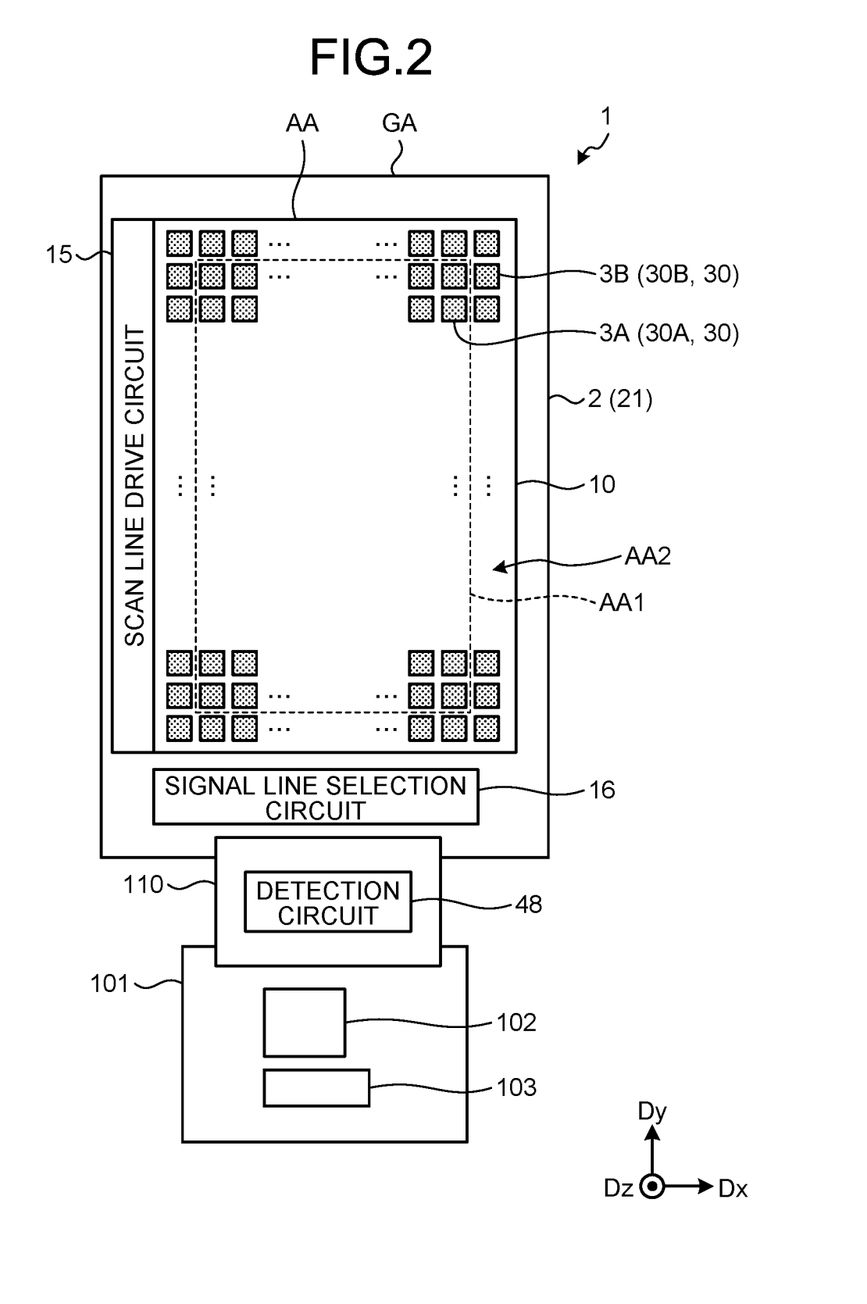
FIG. 2 is a plan view illustrating the detection device according to the embodiment.

FIG. 2 is a plan view illustrating the detection device according to the embodiment. A first direction Dx illustrated in FIG. 2 and later figures is one direction in a plane parallel to a substrate 21 (sensor region AA). A second direction Dy is another direction in the plane parallel to the substrate 21 (sensor region AA), and is a direction orthogonal to the first direction Dx. A third direction Dz is a direction orthogonal to the first direction Dx and the second direction Dy, and is a direction normal to the substrate 21.

As illustrated in FIG. 2, the detection device 1 includes an array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor 10, the scan line drive circuit 15, and the signal line selection circuit 16 to control operations of the sensor 10. The power supply circuit 103 supplies voltage signals including, for example, a power supply potential VDD and a reference potential VCOM (refer to FIG. 5) to the sensor 10, the scan line drive circuit 15, and the signal line selection circuit 16. Although the present embodiment exemplifies the case of disposing the detection circuit 48 on the wiring substrate 110, the present disclosure is not limited to this case. The detection circuit 48 may be disposed on the substrate 21.

The substrate 21 has the sensor region AA and a peripheral region GA. The sensor region AA and the peripheral region GA extend in a planar direction parallel to the substrate 21. Elements (a detection element 3A and a dummy element 3B) of the sensor 10 are provided in the sensor region AA. The peripheral region GA is a region outside the sensor region AA, and is a region not provided with the elements (the detection element 3A and the dummy element 3B). That is, the peripheral region GA is a region between the outer circumference of the sensor region AA and outer edges of the substrate 21. The scan line drive circuit 15 and the signal line selection circuit 16 are provided in the peripheral region GA. The scan line drive circuit 15 is provided in a region extending along the second direction Dy in the peripheral region GA. The signal line selection circuit 16 is provided in a region extending along the first direction Dx in the peripheral region GA and is provided between the sensor 10 and the detection circuit 48.

The sensor region AA includes a detection region AA1 located in a central portion of the sensor region AA and a frame-like dummy region AA2 along the contour of the sensor region AA. The detection region AA1 has a rectangular shape. The dummy region AA2 has a rectangular frame shape and surrounds the detection region AA1. The detection region AA1 is provided with the detection element 3A that detects, for example, the fingerprint and the information on the living body. The dummy region AA2 is provided with the dummy element 3B that does not detect, for example, the fingerprint.

Figure 3:
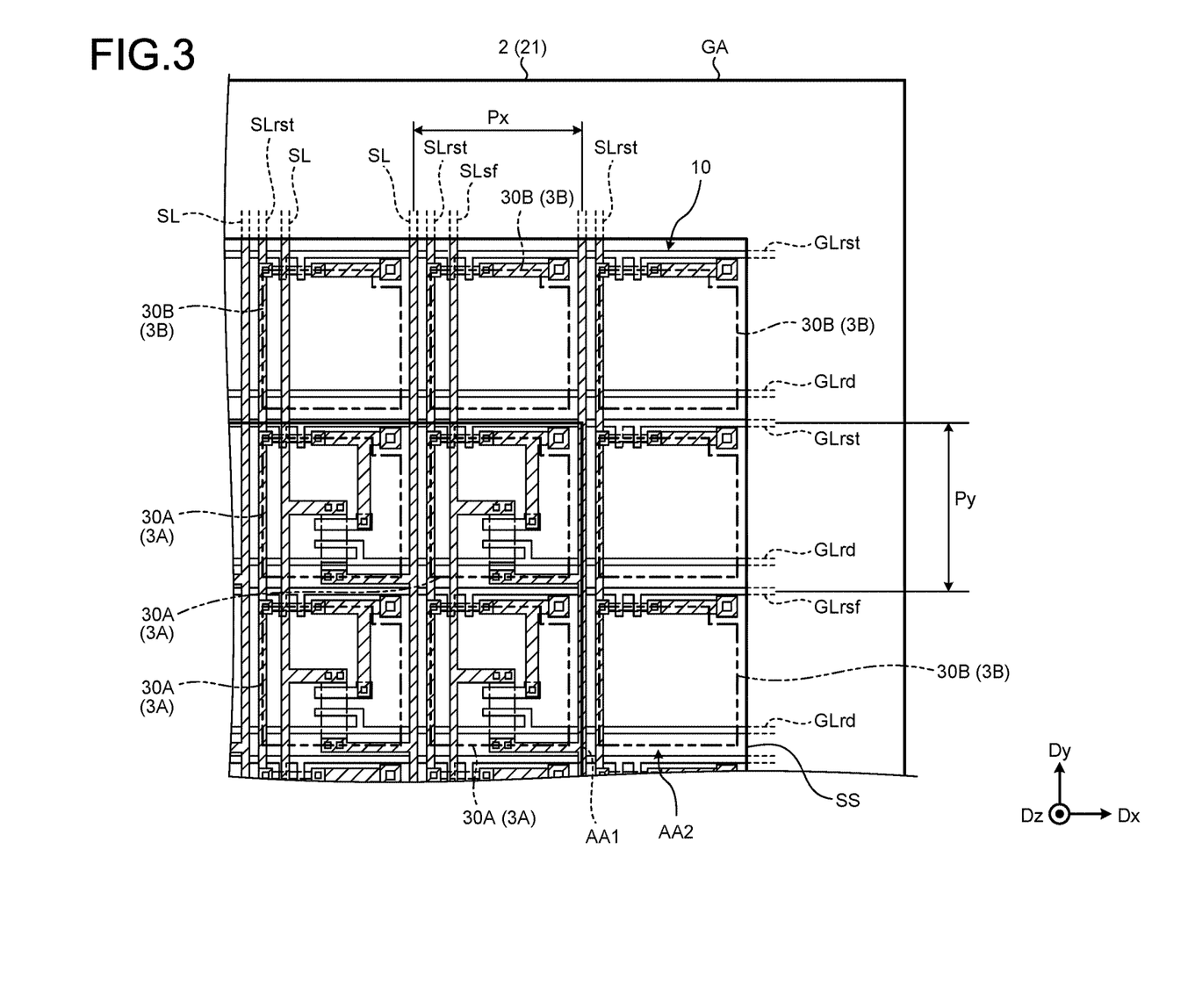
FIG. 3 is a plan view obtained by enlarging a portion of a substrate of the embodiment.

FIG. 3 is a plan view obtained by enlarging a portion of the substrate of the embodiment. As illustrated in FIG. 3, the substrate 21 includes two kinds of scan lines (a read control scan line GLrd and a reset control scan line GLrst) and three kinds of signal lines (an output signal line SL, a power supply signal line SLsf, and a reset signal line SLrst). The read control scan line GLrd and the reset control scan line GLrst are led out from the scan line drive circuit 15 into the sensor region AA. The read control scan line GLrd and the reset control scan line GLrst extend in the first direction Dx and are arranged in the second direction Dy in the sensor region AA. The output signal line SL, the power supply signal line SLsf, and the reset signal line SLrst are led out from the signal line selection circuit 16 into the sensor region AA. The output signal line SL, the power supply signal line SLsf, and the reset signal line SLrst extend in the second direction Dy and are arranged in the first direction Dx in the sensor region AA.

A region surrounded by two scan lines and two signal lines corresponds to one unit region. In the present embodiment, a region surrounded by two output signal lines SL separately arranged in the first direction Dx and two reset control scan lines GLrst separately arranged in the second direction Dy corresponds to one unit region. The detection element 3A or the dummy element 3B of the sensor 10 is disposed one in each unit region. That is, an arrangement pitch Px in the first direction Dx of the one unit region is defined by an arrangement pitch of the output signal lines SL, and an arrangement pitch Py in the second direction Dy of the one unit region is defined by an arrangement pitch of the reset control scan lines GLrst. The dummy region AA2 of the present embodiment occupies a width of one unit region from the contour of the sensor region AA.

The sensor 10 includes a plurality of the detection elements 3A and a plurality of the dummy elements 3B. The dummy elements 3B are provided in the dummy region AA2. In other words, the dummy elements 3B are arranged along the contour of the sensor region AA. The detection elements 3A are provided in the detection region AA1. That is, the detection elements 3A are arranged on an inner side of the frame-like dummy region AA2.

Each of the detection element 3A and the dummy element 3B includes a photoelectric conversion element 30. Each photoelectric conversion element 30 is a photodiode and outputs an electrical signal corresponding to light irradiating the photoelectric conversion element 30. More specifically, the photoelectric conversion element 30 is a positive-intrinsic-negative (PIN) photodiode. Hereinafter, the photoelectric conversion element 30 of the detection element 3A is called a "photoelectric conversion element 30A", and the photoelectric conversion element 30 of the dummy element 3B is called a "photoelectric conversion element 30B". A plurality of the detection elements 3A and a plurality of the dummy elements 3B may be collectively called a plurality of photosensors. The photoelectric conversion element 30B of the dummy element 3B may be called a first photodiode. The photoelectric conversion element 30A of the detection element 3A may be called a second photodiode.

The photoelectric conversion element 30A of the detection element 3A operates in accordance with a gate drive signal (a reset control signal RST or a read control signal RD) supplied from the scan line drive circuit 15. Each photoelectric conversion element 30A outputs an electrical signal corresponding to light irradiating the photoelectric conversion element 30A as a detection signal Vdet to the signal line selection circuit 16. The detection device 1 detects the information on the living body based on the detection signals Vdet received from the photoelectric conversion elements 30. The photoelectric conversion element 30B of the dummy element 3B operates in accordance with the gate drive signal (reset control signal RST) supplied from the scan line drive circuit 15. The photoelectric conversion element 30B generates an electrical signal corresponding to the irradiating light but does not output the electrical signal to the signal line selection circuit 16 because the photoelectric conversion element 30B is not coupled to the signal line selection circuit 16.

Figure 4:
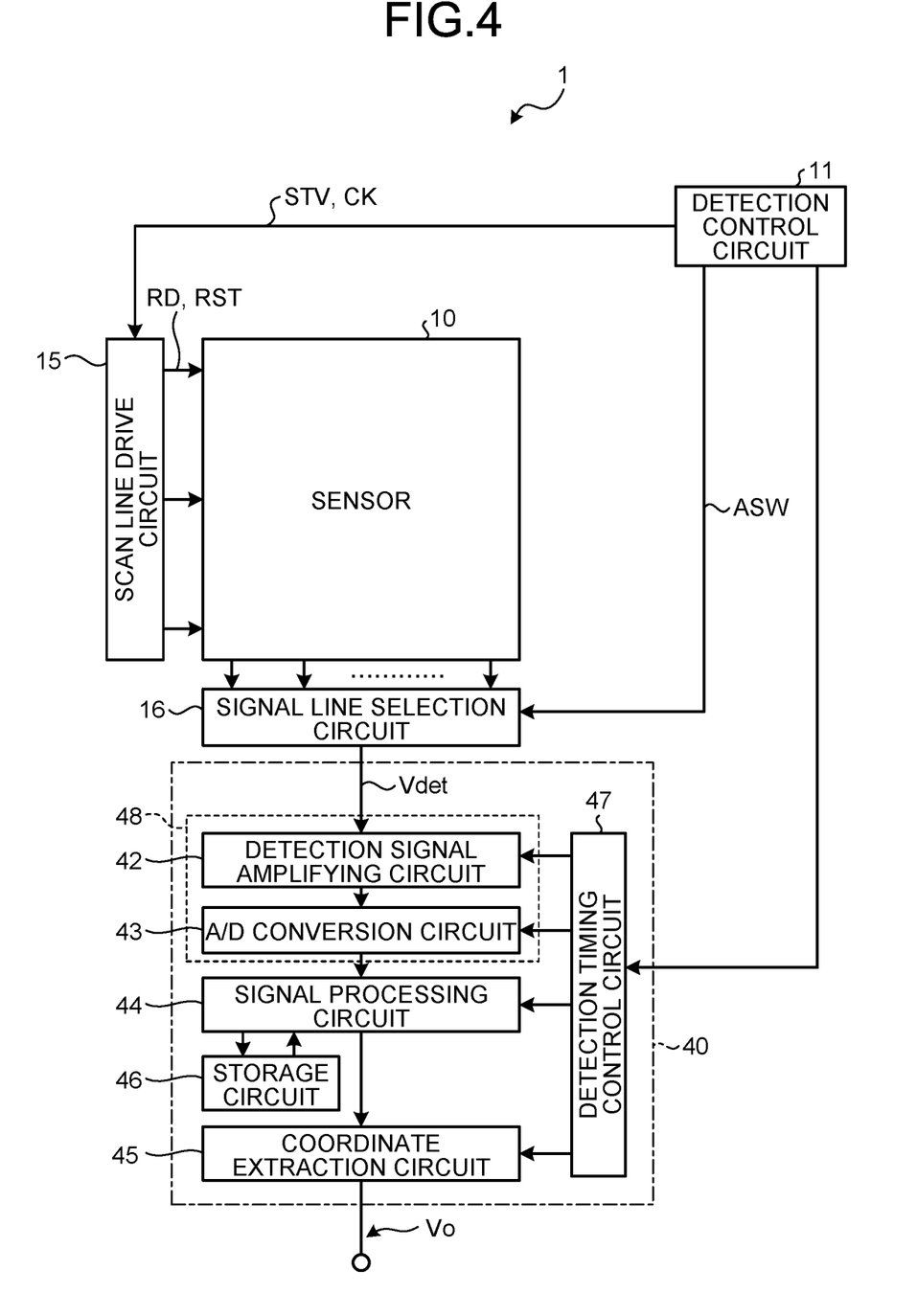
FIG. 4 is a block diagram illustrating a configuration example of the detection device according to the embodiment.

FIG. 4 is a block diagram illustrating a configuration example of the detection device according to the embodiment. As illustrated in FIG. 4, the detection device 1 further includes a detection control circuit 11 and a detector 40. One, some, or all functions of the detection control circuit 11 are included in the control circuit 102. One, some, or all functions of the detector 40 other than those of the detection circuit 48 are also included in the control circuit 102.

The detection control circuit 11 supplies control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 drives a plurality of scan lines (the read control scan lines GLrd and the reset control scan lines GLrst (refer to FIG. 3)) based on the various control signals. The scan line drive circuit 15 sequentially or simultaneously selects the scan lines and supplies the gate drive signal (for example, the reset control signal RST or the read control signal RD) to the selected scan lines. Through this operation, the scan line drive circuit 15 selects the photoelectric conversion elements 30 coupled to the scan lines.

The signal line selection circuit 16 is a switching circuit that sequentially or simultaneously selects the output signal lines SL (refer to FIG. 3). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signal Vdet of the photoelectric conversion element 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front end (AFE) circuit. The detection circuit 48 is a signal processing circuit having functions of at least a detection signal amplifying circuit 42 and an analog-to-digital (A/D) conversion circuit 43. The detection signal amplifying circuit 42 is a circuit that amplifies the detection signal Vdet, and is, for example, an integration circuit. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect ridges and varies on a surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include an image of a blood vessel of the finger Fg or the palm, a pulse wave, pulsation, and blood oxygen saturation.

The storage circuit 46 temporarily stores signals calculated by the signal processing circuit 44. The storage circuit 46 may be, for example, a random-access memory (RAM) or a register circuit.

The coordinate extraction circuit 45 is a logic circuit that obtains detected coordinates of the ridges and varies on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3A of the sensor 10 to generate two-dimensional information representing a shape of the ridges and varies on the surface of the finger Fg or the like. The coordinate extraction circuit 45 may output the detection signals Vdet as sensor outputs Vo instead of calculating the detected coordinates.

Figure 5:
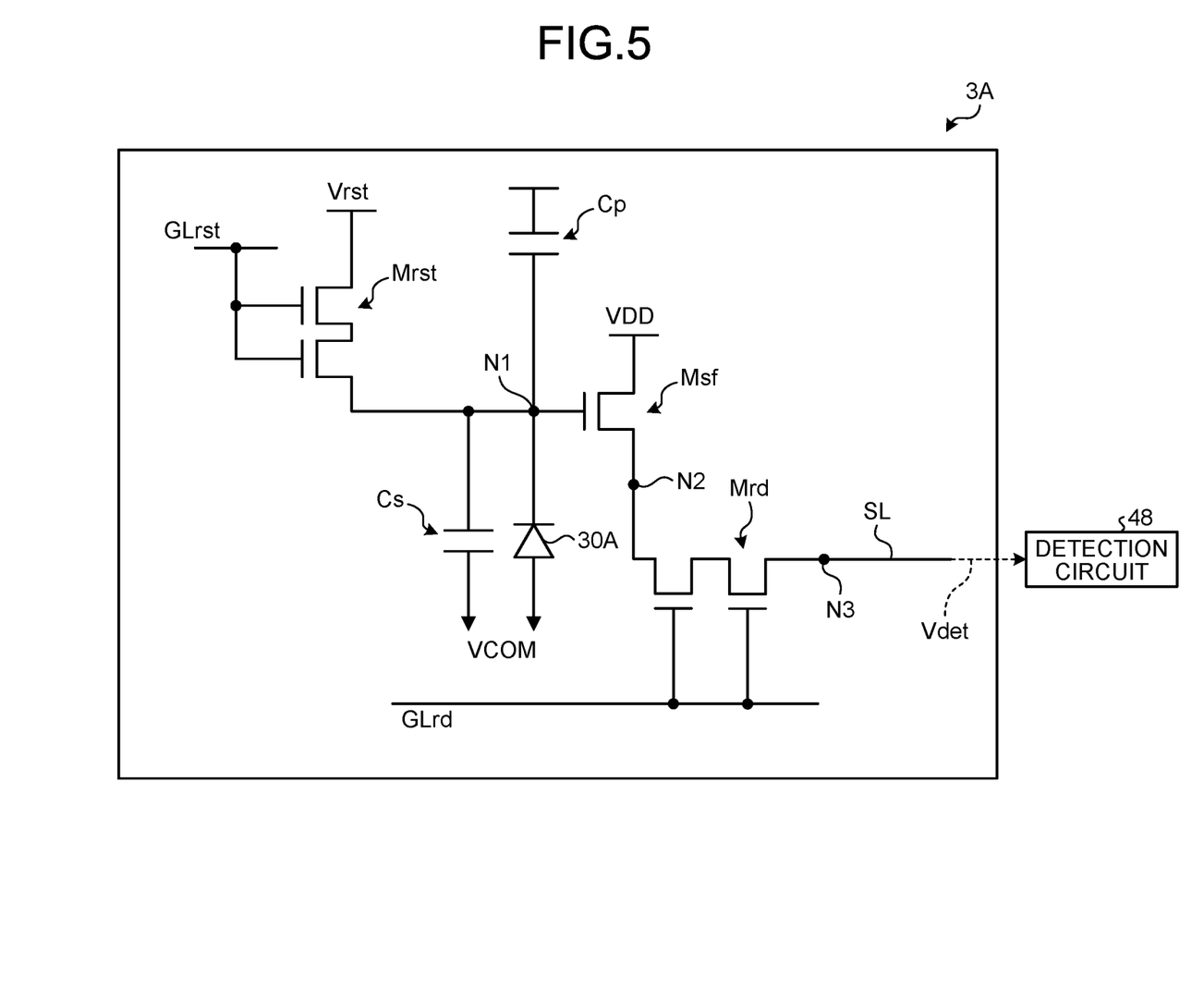
FIG. 5 is a circuit diagram illustrating a detection element.

The following describes a circuit configuration example of the detection device 1. FIG. 5 is a circuit diagram illustrating the detection element. As illustrated in FIG. 5, the detection element 3A includes the photoelectric conversion element 30A, a reset transistor Mrst, a read transistor Mrd, and a source follower transistor Msf. Each of the reset transistor Mrst, the read transistor Mrd, and the source follower transistor Msf is made up of an n-type thin film transistor (TFT). However, each of the transistors is not limited thereto and may be made up of a p-type TFT.

The reference potential VCOM is applied to an anode of the photoelectric conversion element 30A. A cathode of the photoelectric conversion element 30A is coupled to a node N1. The node N1 is coupled to a capacitive element Cs, one of the source and the drain of the reset transistor Mrst, and the gate of the source follower transistor Msf. In addition, the node N1 has parasitic capacitance Cp. When light enters the photoelectric conversion element 30A, a signal (electrical charge) output from the photoelectric conversion element 30A is stored in the capacitive element Cs.

The gates of the reset transistor Mrst are coupled to the reset control scan line GLrst. One of the source and the drain of the reset transistor Mrst is coupled to the reset signal line SLrst and is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photoelectric conversion element 30A is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with the signal (electrical charge) generated by the photoelectric conversion element 30A. This operation causes the source follower transistor Msf to output a signal voltage corresponding to the signal (electrical charge) generated by the photoelectric conversion element 30A to the read transistor Mrd.

The read transistor Mrd is coupled between the source of the source follower transistor Msf (node N2) and the output signal line SL (node N3). The gates of the read transistor Mrd are coupled to the read control scan line GLrd. When the read transistor Mrd is turned on in response to the read control signal RD, the signal output from the source follower transistor Msf, that is, the signal voltage corresponding to the signal (electrical charge) generated by the photoelectric conversion element 30A is output as the detection signal Vdet to the output signal line SL.

Figure 6:
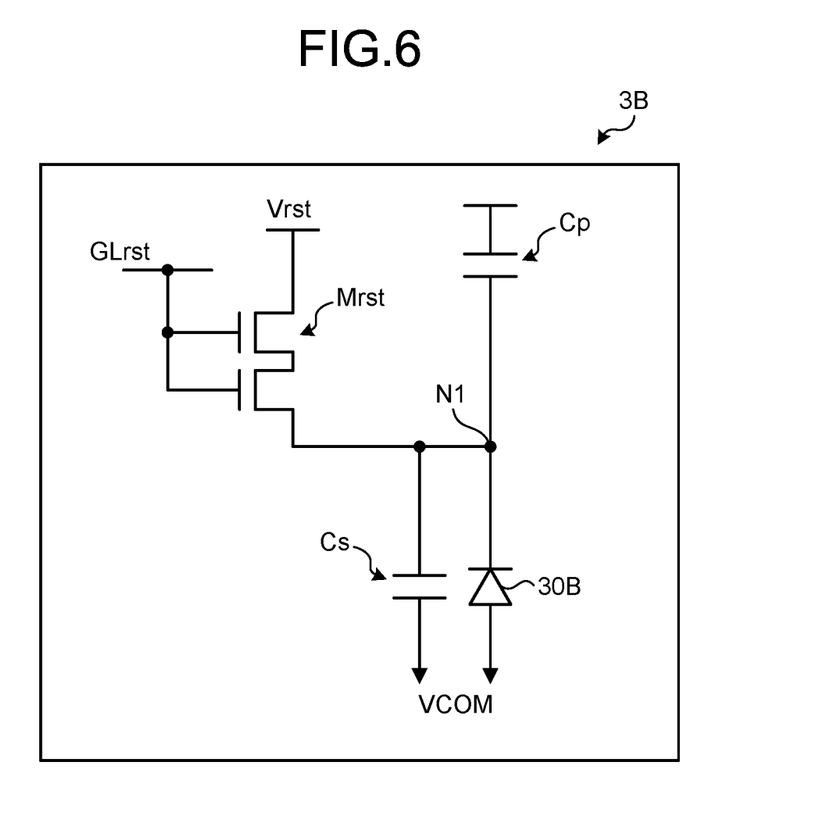
FIG. 6 is a circuit diagram illustrating a dummy element.

FIG. 6 is a circuit diagram illustrating the dummy element. As illustrated in FIG. 6, the dummy element 3B includes the photoelectric conversion element 30B and the reset transistor Mrst. The reference potential VCOM is applied to the anode of the photoelectric conversion element 30B. The cathode of the photoelectric conversion element 30 is coupled to the node N1. The node N1 is coupled to the capacitive element Cs and one of the source and the drain of the reset transistor Mrst. In addition, the node N1 has parasitic capacitance Cp. When the photoelectric conversion element 30 is irradiated with light, the signal (electrical charge) output from the photoelectric conversion element 30 is stored in the capacitive element Cs.

The gates of the reset transistor Mrst are coupled to the reset control scan line GLrst. The other one of the source and the drain of the reset transistor Mrst is coupled to the reset signal line SLrst and is supplied with the reset potential Vrst. When the reset transistor Mrst is turned on (into the conduction state) in response to the reset control signal RST, the potential of the node N1 is reset to the reset potential Vrst. The reference potential VCOM is lower than the reset potential Vrst, and the photoelectric conversion element 30 is driven in the reverse bias state.

The dummy element 3B includes neither the read transistor Mrd nor the source follower transistor Msf. Hence, the dummy element 3B is coupled to neither the read control scan line GLrd coupled to the read transistor Mrd nor the output signal line SL coupled to the source follower transistor Msf. As a result, the signal (electrical charge) generated by the photoelectric conversion element 30B is not output as the detection signal Vdet to the output signal line SL.

The reset transistor Mrst and the read transistor Mrd illustrated in FIG. 5 and the reset transistor Mrst illustrated in FIG. 6 each have what is called a double-gate structure configured by coupling two transistors in series. However, the structures of those transistors are not limited thereto; the reset transistor Mrst and the read transistor Mrd may have a single-gate structure or a structure configured by coupling three or more transistors in series.

Figure 7:
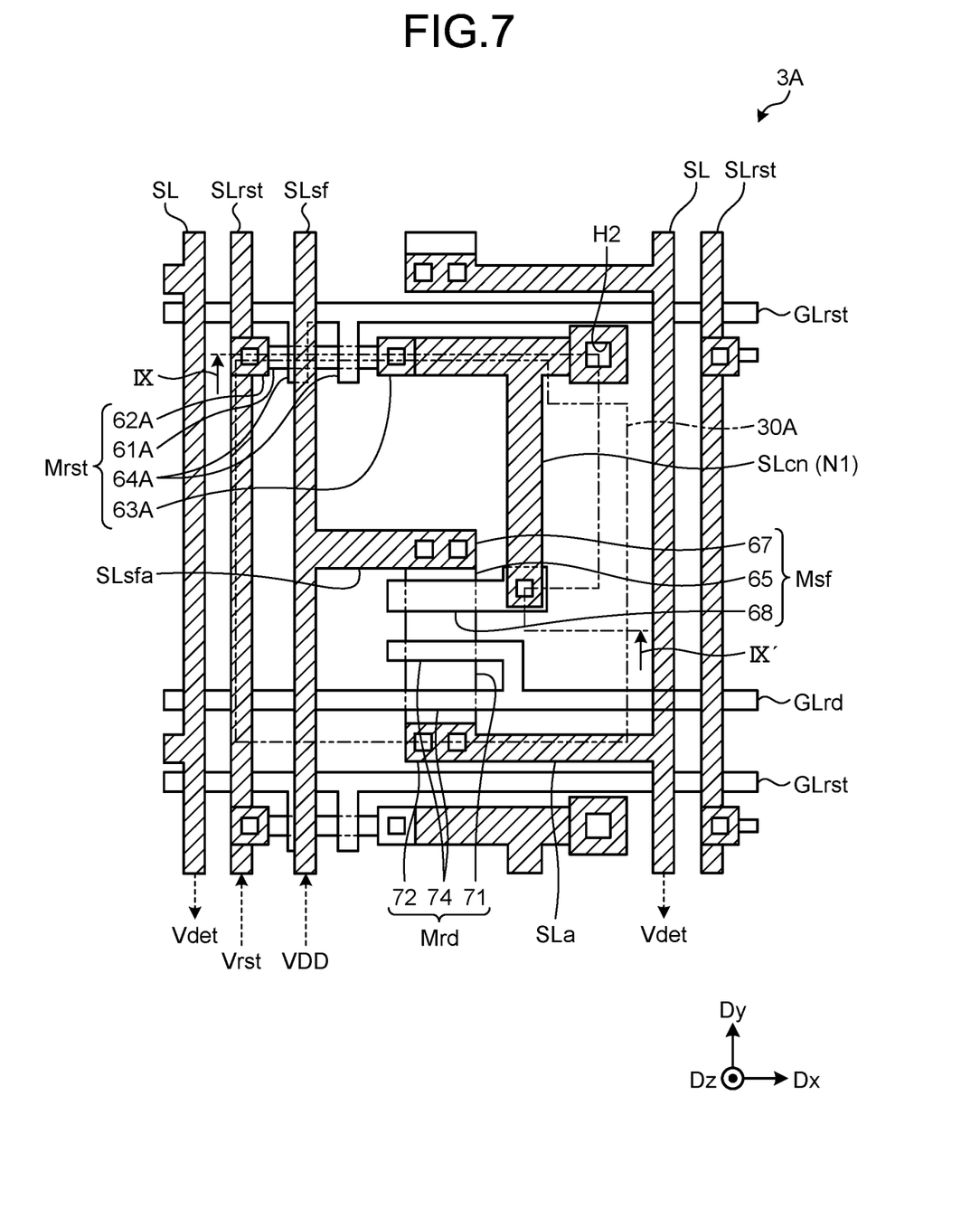
FIG. 7 is a plan view illustrating the detection element.
Figure 8:
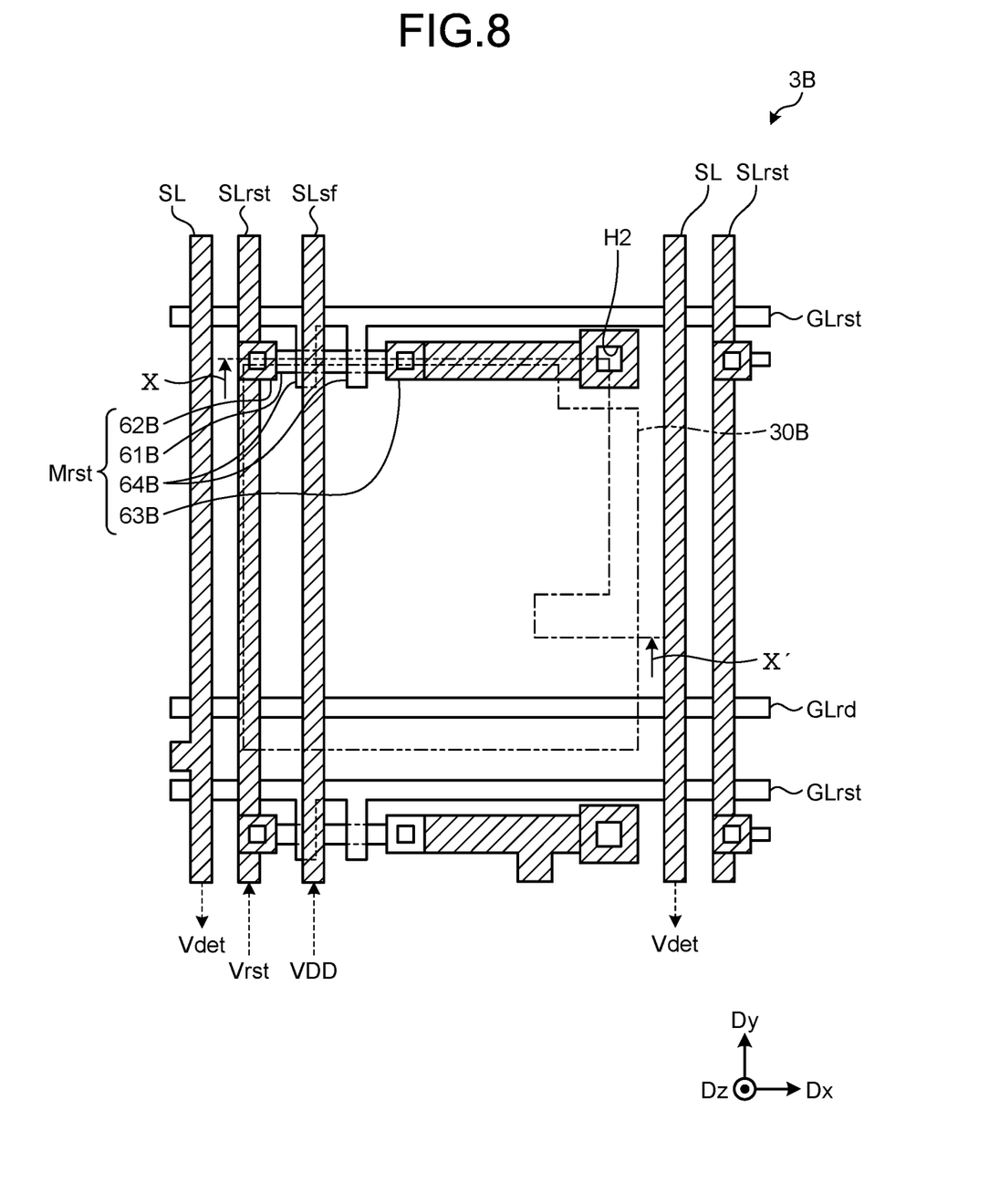
FIG. 8 is a plan view illustrating the dummy element.

The following describes planar configurations of the detection element 3A and the dummy element 3B. FIG. 7 is a plan view illustrating the detection element. FIG. 8 is a plan view illustrating the dummy element. The detection element 3A and the dummy element 3B include the photoelectric conversion elements 30A and 30B and the reset transistor Mrst as a common configuration. Therefore, the common parts (the photoelectric conversion elements 30A and 30B and the reset transistor Mrst) will be collectively described with reference to FIGS. 7 and 8.

As illustrated in FIGS. 7 and 8, the photoelectric conversion element 30A of the detection element 3A and the photoelectric conversion element 30B of the dummy element 3B are each provided in a region surrounded by two of the reset control scan lines GLrst adjacent in the second direction Dy and two of the output signal lines SL adjacent in the first direction Dx. Consequently, the photosensors (the photoelectric conversion elements 30A and the photoelectric conversion elements 30B) are regularly arranged in the first direction Dx and the second direction Dy.

As illustrated in FIGS. 7 and 8, the reset transistors Mrst of the detection element 3A and the dummy element 3B respectively include semiconductor layers 61A and 61B, source electrodes 62A and 62B, drain electrodes 63A and 63B, and gate electrodes 64A and 64B. One end of each of the semiconductor layers 61A and 61B is coupled to the reset signal line SLrst. The other end of each of the semiconductor layers 61A and 61B is coupled to coupling wiring SLcn. Portions of the reset signal lines SLrst coupled to the semiconductor layers 61A and 61B serve as the source electrodes 62A and 62B, respectively. Portions of the coupling wiring SLcn coupled to the semiconductor layers 61A and 61B serve as the drain electrodes 63A and 63B, respectively. The reset control scan line GLrst is provided with two branches branching in the second direction Dy, and each of the semiconductor layers 61A and 61B intersects the two branches of the corresponding reset control scan line GLrst. Channel regions are formed at portions of each of the semiconductor layers 61A and 61B overlapping the two branches of the corresponding reset control scan line GLrst. Portions of the two branches of the reset control scan line GLrst overlapping the semiconductor layer 61A serve as the gate electrodes 64A. Portions of the two branches of the reset control scan line GLrst overlapping the semiconductor layer 61B serve as the gate electrodes 64B.

As illustrated in FIG. 7, the source follower transistor Msf of the detection element 3A includes a semiconductor layer 65, a source electrode 67, and a gate electrode 68. One end of the semiconductor layer 65 is coupled to the power supply signal line SLsf through a coupling portion SLsfa. The other end of the semiconductor layer 65 is coupled to the read transistor Mrd. A portion of the coupling portion SLsfa coupled to the semiconductor layer 65 serves as the source electrode 67.

One end of the gate electrode 68 of the detection element 3A is coupled to the coupling wiring SLcn through a contact hole. The semiconductor layer 65 intersects the gate electrode 68. That is, the reset transistor Mrst is electrically coupled to the gate of the source follower transistor Msf through the coupling wiring SLcn.

The cathode (n-type semiconductor layer 33A) of the photoelectric conversion element 30A of the detection element 3A is coupled to the coupling wiring SLcn through a contact hole H2. This configuration electrically couples the cathode (n-type semiconductor layer 33) of the photoelectric conversion element 30A to the reset transistor Mrst and the source follower transistor Msf through the coupling wiring SLcn.

The read transistor Mrd includes a semiconductor layer 71, a drain electrode 72, and gate electrodes 74. One end of the semiconductor layer 71 is coupled to the semiconductor layer 65 of the source follower transistor Msf. In the present embodiment, the semiconductor layers 65 and 71 are formed of a common semiconductor layer. The other end of the semiconductor layer 71 is coupled to the output signal line SL through a coupling portion SLa. In other words, a portion of the coupling portion SLa coupled to the semiconductor layer 71 serves as the drain electrode 72. The read control scan line GLrd is coupled to a branch that is adjacent to the read control scan line GLrd in the second direction Dy and extends in the first direction Dx. The semiconductor layer 71 intersects the read control scan line GLrd and the branch. Portions of the read control scan line GLrd and the branch overlapping the semiconductor layer 71 serve as the gate electrodes 74. With the above-described configuration, the source follower transistor Msf and the read transistor Mrd are coupled to the output signal line SL.

The planar configurations of the photoelectric conversion elements 30A and 30B and the transistors illustrated in FIGS. 7 and 8 are merely examples, and can be changed as appropriate. For example, the present disclosure is not limited to the configuration in which the transistors are arranged in the second direction Dy. One or some of the transistors may each be provided at a different location, for example, by being arranged adjacent to another transistor in the first direction Dx. The arrangement of the signal lines and the scan lines may also be appropriately changed depending on the arrangement of the transistors.

Figure 9:
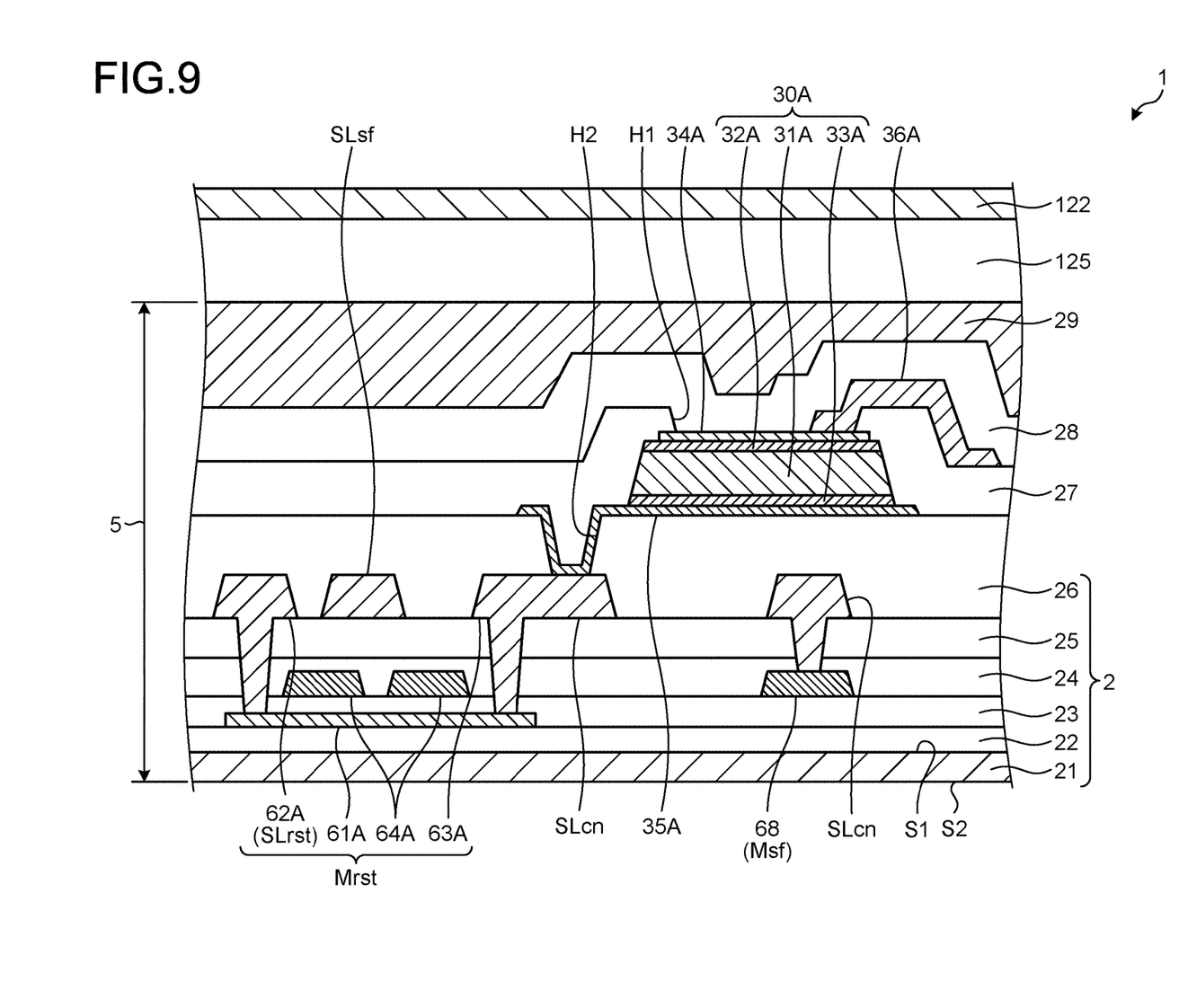
FIG. 9 is a sectional view of the detection element, and is, in detail, a IX-IX' sectional view of FIG. 7.
Figure 10:
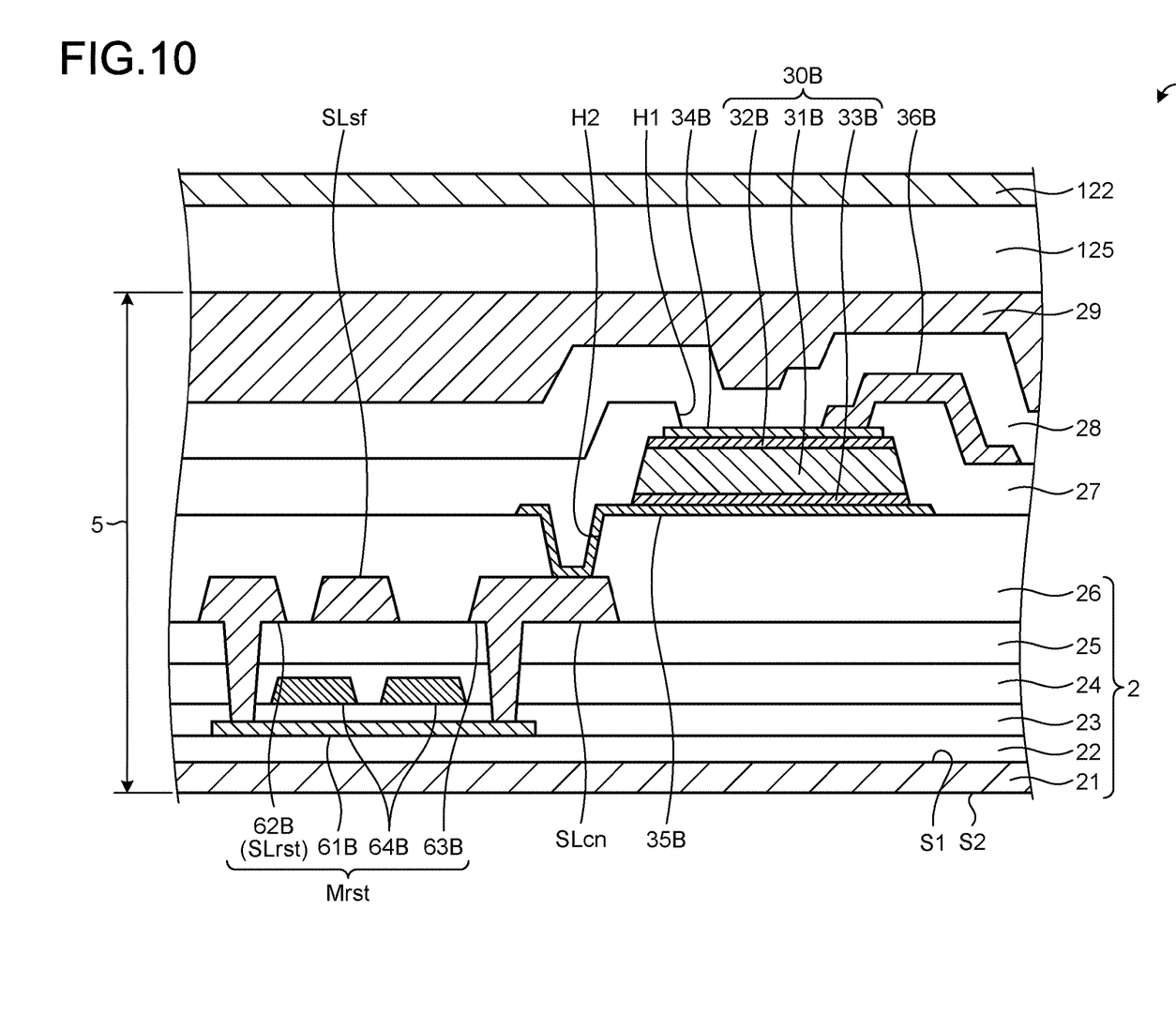
FIG. 10 is a sectional view of the dummy element, and is, in detail, a X-X' sectional view of FIG. 8.

The following describes sectional configurations of the detection element 3A and the dummy element 3B. FIG. 9 is a sectional view of the detection element and is, in detail, an IX-IX' sectional view of FIG. 7. FIG. 10 is a sectional view of the dummy element and is, in detail, an X-X' sectional view of FIG. 8. The detection element 3A and the dummy element 3B are formed on the same substrate 21 and have substantially the same sectional configuration. Therefore, the detection element 3A and the dummy element 3B will be collectively described with reference to FIGS. 9 and 10. While FIG. 9 illustrates a sectional configuration of the reset transistor Mrst among the three transistors included in the detection element 3A, each of the source follower transistor Msf and the read transistor Mrd also has a sectional configuration similar to that of the reset transistor Mrst.

As illustrated in FIGS. 9 and 10, the substrate 21 is an insulating substrate. For example, a glass substrate of, for example, quartz or alkali-free glass is used as the substrate 21. The substrate 21 has a first principal surface 51 and a second principal surface S2 on the opposite side of the first principal surface 51. The first principal surface 51 of the substrate 21 is provided with various transistors including the reset transistor Mrst, various types of wiring (the scan lines and the signal lines), and insulating films to form the array substrate 2. The photoelectric conversion elements 30A and 30B are arranged on the array substrate 2, that is, on the first principal surface 51 side of the substrate 21.

An undercoat film 22 is provided on the first principal surface 51 of the substrate 21. The undercoat film 22, insulating films 23, 24, and 25, and insulating films 27 and 28 are inorganic insulating films, and are formed of, for example, a silicon oxide ($SiO_2$) or a silicon nitride (SiN).

The semiconductor layers 61A and 61B are provided on the undercoat film 22. For example, polysilicon is used as the semiconductor layers 61A and 61B. The semiconductor layers 61A and 61B are, however, not limited thereto, and may be formed of, for example, a microcrystalline oxide semiconductor, an amorphous oxide semiconductor, or low-temperature polycrystalline silicon (LTPS).

The insulating film 23 is provided on the undercoat film 22 so as to cover the semiconductor layers 61A and 61B. The gate electrodes 64A and 64B are provided on the insulating film 23. The gate electrode 68 of the source follower transistor Msf is also provided in the same layer as that of the gate electrodes 64A and 64B on the insulating film 23. The reset control scan line GLrst and the read control scan line GLrd are also provided in the same layer as that of the gate electrodes 64A and 64B. The insulating film 24 is provided on the insulating film 23 so as to cover the gate electrodes 64A and 64B. In the detection region AA1, the insulating film 24 covers the source follower transistor Msf as illustrated in FIG. 9.

As illustrated in FIGS. 9 and 10, each of the reset transistors Mrst have a top-gate structure in which the gate electrode 64A or 64B is provided on the upper side of the semiconductor layer 61A or 61B. However, in the detection device 1 of the present disclosure, the reset transistor Mrst may have a bottom-gate structure in which the gate electrode 64A or 64B is provided on the lower side of the semiconductor layer 61A or 61B, or a dual-gate structure in which the gate electrode 64A or 64B is provided on the upper side and lower side of the semiconductor layers 61A and 61B.

The insulating films 24 and 25 are provided on the insulating film 23 so as to cover the gate electrodes 64A and 64B. The source electrodes 62A and 62B and the drain electrodes 63A and 63B are provided on the insulating film 25. The source electrodes 62A and 62B and the drain electrodes 63A and 63B are respectively coupled to the semiconductor layers 61A and 61B through a contact hole penetrating the insulating films 23, 24, and 25. The source electrodes 62A and 62B and the drain electrodes 63A and 63B are formed of, for example, a multilayered film Ti—Al—Ti or Ti—Al having a multilayered structure of titanium and aluminum.

The various signal lines (the output signal line SL, the power supply signal line SLsf, and the reset signal line SLrst) and the coupling wiring SLcn are provided in the same layer as that of the source electrodes 62A and 62B and the drain electrodes 63A and 63B. As illustrated in FIG. 9, the coupling wiring SLcn of the detection element 3A is coupled to the gate electrode 68 of the source follower transistor Msf through a contact hole penetrating the insulating films 24 and 25.

As illustrated in FIGS. 9 and 10, an insulating film 26 is provided on the insulating film 25 so as to cover the various transistors including, for example, the reset transistor Mrst. The insulating film 26 is formed of an organic material such as a photosensitive acrylic resin. The insulating film 26 is thicker than the insulating film 25. The insulating film 26 has a better step covering property than that of inorganic insulating materials, and can planarize steps formed by the various transistors and the various types of wiring.

The following describes sectional configurations of the photoelectric conversion elements 30A and 30B. The photoelectric conversion elements 30A and 30B are provided on the insulating film 26. Specifically, lower conductive layers 35A and 35B are provided on the insulating film 26 and are electrically coupled to the coupling wiring SLcn through the contact holes H2. The photoelectric conversion elements 30A and 30B are coupled to the lower conductive layers 35A and 35B. In a plan view, the lower conductive layers 35A and 35B have larger areas than those of the photoelectric conversion elements 30A and 30B. The lower conductive layers 35A and 35B can employ, for example, a multilayered structure of titanium (Ti) and titanium nitride (TiN). Since the lower conductive layers 35A and 35B are provided between the substrate 21 and the photoelectric conversion elements 30A and 30B, the lower conductive layers 35A and 35B serve as light blocking layers, and can restrain light from entering the photoelectric conversion elements 30A and 30B from the second principal surface S2 side of the substrate 21.

The photoelectric conversion elements 30A and 30B are configured so as to include semiconductor layers having a photovoltaic effect. Specifically, the semiconductor layers of the photoelectric conversion elements 30A and 30B include i-type semiconductor layers 31A and 31B, p-type semiconductor layers 32A and 32B, and n-type semiconductor layers 33A and 33B. The i-type semiconductor layers 31A and 31B, the p-type semiconductor layers 32A and 32B, and the n-type semiconductor layers 33A and 33B are formed of, for example, amorphous silicon (a-Si). The material of the semiconductor layers is not limited thereto, and may be, for example, polysilicon or microcrystalline silicon.

The a-Si of each of the p-type semiconductor layers 32A and 32B is doped with impurities to form a p+ region. The a-Si of each of the n-type semiconductor layers 33A and 33B is doped with impurities to form an n+ region. The i-type semiconductor layers 31A and 31B are, for example, non-doped intrinsic semiconductors and have lower conductivity than that of the p-type semiconductor layers 32A and 32B and the n-type semiconductor layers 33A and 33B.

The i-type semiconductor layers 31A and 31B are provided between the n-type semiconductor layers 33A and 33B and the p-type semiconductor layers 32A and 32B in a direction orthogonal to a surface of the substrate 21 (in the third direction Dz). In the present embodiment, the n-type semiconductor layers 33A and 33B, the i-type semiconductor layers 31A and 31B, and the p-type semiconductor layers 32A and 32B are stacked on the lower conductive layers 35A and 35B in the order as listed.

With this configuration, the n-type semiconductor layer 33A of the photoelectric conversion element 30A of the detection element 3A is electrically coupled to the reset transistor Mrst and the source follower transistor Msf through the lower conductive layer 35A and the coupling wiring SLcn. By contrast, the n-type semiconductor layer 33B of the photoelectric conversion element 30B of the dummy element 3B is electrically coupled to the reset transistor Mrst through the lower conductive layer 35B and the coupling wiring SLcn.

Upper electrodes 34A and 34B are provided on the p-type semiconductor layers 32A and 32B. The upper electrodes 34A and 34B are formed of, for example, a light-transmitting conductive material such as indium tin oxide (ITO). The insulating film 27 is provided on the insulating film 26 so as to cover the photoelectric conversion elements 30A and 30B and the upper electrodes 34A and 34B. The insulating film 27 is provided with contact holes H1 in regions overlapping the upper electrodes 34A and 34B.

Coupling wiring 36A and coupling wiring 36B are provided on the insulating film 27, and are electrically coupled to the upper electrodes 34A and 34B through the contact holes H1. The p-type semiconductor layers 32A and 32B are supplied with the reference potential VCOM (refer to FIGS. 5 and 6) through the coupling wiring 36A and 36B.

The insulating film 28 is provided on the insulating film 27 so as to cover the upper electrodes 34A and 34B and the coupling wiring 36A and 36B. The insulating film 28 is provided as a protection layer for restraining water from entering the photoelectric conversion elements 30A and 30B. In addition, an insulating film 29 is provided on the insulating film 28. The insulating film 29 is a hard coat film formed of an organic material. The insulating film 29 planarizes steps on a surface of the insulating film 28 formed by the photoelectric conversion elements 30A and 30B and the coupling wiring 36A and 36B.

The cover member 122 is provided so as to face the insulating film 29. That is, the cover member 122 is provided so as to cover the various transistors and the photoelectric conversion elements 30A and 30B. The adhesive layer 125 bonds the insulating film 29 to the cover member 122. The adhesive layer 125 is, for example, a light-transmitting optical clear adhesive (OCA) sheet.

The following describes operational advantages of the detection apparatus 120 having an illumination device according to the embodiment. As illustrated in FIG. 1A, when the fingerprint is detected, the light L1 emitted from the illumination device 121 hits the finger Fg (refer to FIG. 1A). The light L2 that has hit and reflected from the finger Fg enters the sensor region AA. The light L2 enters the photoelectric conversion elements 30A of the detection elements 3A provided in the detection region AA1 and the photoelectric conversion elements 30B of the dummy elements 3B provided in the dummy region AA2. The photoelectric conversion elements 30A and 30B generate the signals (electrical charges) based on the incident light. This generates the parasitic capacitance in the photoelectric conversion elements 30A and 30B.

A photoelectric conversion element 30A that is disposed in the detection region AA1 and away inward from the contour of the detection region AA1 by one pitch is adjacent to other photoelectric conversion elements 30A in the first direction Dx and the second direction Dy. Consequently, the photoelectric conversion element 30A is affected by the parasitic capacitance generated in four of the photoelectric conversion elements 30A adjacent thereto in the first direction Dx and the second direction Dy.

By contrast, as illustrated in FIG. 3, a photoelectric conversion element 30A disposed in the detection region AA1 and alongside of the contour of the detection region AA1 is adjacent to the photoelectric conversion elements 30A and 30B in the first direction Dx and the second direction Dy. Consequently, the photoelectric conversion element 30A is affected by the parasitic capacitance generated in the photoelectric conversion elements 30A and 30B adjacent thereto in the first direction Dx and the second direction Dy.

As a result of the above, the photoelectric conversion elements 30A arranged in the detection region AA1 are made to have no difference in the parasitic capacitance affected from the surroundings, and are made uniform in the parasitic capacitance. As a result, noise added to the signals (electrical charges) converted by the photoelectric conversion elements 30A is also equalized.

After the fingerprint is detected, the scan line drive circuit 15 sequentially selects the read control scan line GLrd. Each of the detection elements 3A coupled to the selected read control scan line GLrd transmits the detection signal Vdet through its respective output signal line SL to the detector 40. Then, the reset control signal is transmitted through the reset control scan line GLrst to each of the detection elements 3A and each of the dummy elements 3B. This causes the photoelectric conversion elements 30A and 30B to be driven in the reverse bias state so as to be in a reset state. As a result, the parasitic capacitance of the photoelectric conversion elements 30A and 30B is also reset.

The following describes the design of the detection device 1. The dummy elements 3B are components for surrounding the detection elements 3A of the detection region AA1 to affect the parasitic capacitance of the photoelectric conversion elements 30A arranged alongside of the contour of the detection region AA1. Therefore, the dummy elements 3B need not have the same size as that of the detection elements 3A. In other words, the dummy elements 3B may be designed to be larger or smaller than the detection elements 3A. Therefore, the detection region AA1 can be determined by arranging the detection elements 3A having a predetermined size in the designated sensor region AA, and the remaining area can be used as the dummy region AA2. Consequently, out of the sensor region AA, a space other than the detection region AA1 can be effectively used. With this design, the detection elements 3A do not fill the entire sensor region AA, so that favorable productivity is achieved.

In the dummy region AA2 of the present embodiment, the region in which the dummy elements 3B are arranged corresponds to one unit region. However, the detection device of the present disclosure is not limited thereto. The region may correspond to a plurality of unit regions. If the dummy elements 3B are arranged in twos so as to form a ring shape in the dummy region AA2, a photoelectric conversion element 30A arranged in the detection region AA1 and alongside of the contour of the detection region AA1 is affected by the parasitic capacitance of two of the photoelectric conversion elements 30B arranged outside thereof. As a result, the parasitic capacitance of the photoelectric conversion element 30A can be closer to the parasitic capacitance by which the photoelectric conversion elements 30A disposed in a central portion of the detection region AA1 are affected.

As described above, the detection device 1 of the embodiment can also equalize the noise added to the signals (electrical charges) converted by the photoelectric conversion elements (photodiode) 30A, and the accuracy of the detected fingerprint is improved. The dummy elements 3B are arranged by using the remaining space of the sensor region AA, so that the detection device 1 is avoided from increasing in size. In addition, the parasitic capacitance of the photoelectric conversion elements 30A and 30B is reset after the fingerprint is detected, so that the components of the detection device 1 are also less affected.

While the preferred embodiment of the present disclosure has been described above, the present disclosure is not limited to the embodiment described above. The content disclosed in the embodiment is merely exemplary, and can be variously changed within the scope not departing from the gist of the present disclosure. Any modification appropriately made within the scope not departing from the gist of the present disclosure also naturally belongs to the technical scope of the present disclosure.

What is claimed is:

1. A detection device comprising:
an insulating substrate;
a detection element including
a first photodiode, and
a plurality of thin film transistors including a first thin film transistor,
a second thin film transistor, and
a third thin film transistor;
a dummy element including
a second photodiode and
a single thin film transistor that is a first thin film transistor; and
a first scan line,
wherein
the first scan line is a gate of the first thin film transistor of the detection element and a gate of the first thin film transistor of the dummy element,
the dummy element is located adjacent to the detection element,
in the detection element, the first thin film transistor is connected to the first photodiode through the second thin film transistor and the third thin film transistor, and
in the dummy element, the first thin film transistor is directly connected to the second photodiode.

2. The detection device of claim 1, wherein,
in the detection element, a cathode of the first photodiode is electrically connected to a drain of the first thin film transistor and a gate of the second thin film transistor, and
in the detection element, a drain of the second thin film transistor is electrically connected to a source of the third thin film transistor.

3. The detection device of claim 2, wherein,
in the dummy element, a cathode of the second photodiode is electrically connected to the drain of the first thin film transistor, and
in the dummy element, the cathode of the second photodiode is not electrically connected to the second thin film transistor.

4. The detection device of claim 3, wherein the insulating substrate is a glass substrate.

5. The detection device of claim 2, wherein,
in the detection element, the first photodiode overlaps the second thin film transistor and the third thin film transistor, in a plan view, and
in the dummy element, the second photodiode overlaps none of the second thin film transistor and the third thin film transistor, in the plan view.

6. The detection device of claim 5, wherein the insulating substrate is a glass substrate.

7. The detection device of claim 6, further comprise a coupling wiring, wherein
the coupling wiring is connected to an anode of the first photodiode and an anode of the second photodiode, and
a reference potential is applied to the anode of the first photodiode and the anode of the second photodiode.

8. The detection device of claim 3, further comprise a first signal line intersecting the first scan line, wherein
the first signal line is connected to a source of the first thin film transistor in the detection element and a source of the second thin film transistor in the dummy element.

9. The detection device of claim 8, further comprises a second signal line extends in parallel to the first signal line, wherein
the second signal line is connected to a source of the second thin film transistor in the detection element, and
the second signal line crosses a semiconductor of the first thin film transistor in the detection element and a semiconductor of the first thin film transistor in the dummy element.

10. The detection device of claim 8, further comprises an output signal line extends in parallel to the first signal line and the second signal line,
wherein
in the detection element, the output signal line is connected to a drain of the third thin film transistor, and
in dummy element, the second photodiode is not electrically connected to the output signal line.

11. A detection device comprising:
a glass substrate;
a detection element including
a first photodiode and
a plurality of thin film transistors;
a dummy element including
a second photodiode and
a single thin film transistor; and
a first scan line,
wherein
in the dummy element, the single thin film transistor is a reset transistor,
in the detection element, the thin film transistors include a reset transistor, and
the first scan line is a gate of the reset transistor of the detection element and a gate of the reset transistor of the dummy element.

12. The detection device of claim 11, wherein,
in the detection element, the thin film transistors further include a source follower transistor and a read transistor,
in the detection element, a cathode of the first photodiode is electrically connected to a drain of the reset transistor and a gate of the source follower transistor, and
in the detection element, a drain of the source follower transistor is electrically connected to a source of the read transistor.

13. The detection device of claim 12, wherein,
in the dummy element, a cathode of the second photodiode is electrically connected only to the drain of the reset transistor.

* * * * *